(12) United States Patent
Heider et al.

(10) Patent No.: US 9,337,069 B2
(45) Date of Patent: May 10, 2016

(54) METHOD FOR GLASS SHEET SEMICONDUCTOR COATING

(75) Inventors: James E. Heider, Bowling Green, OH (US); Michael J. Cicak, Perrysburg, OH (US); Leo Adoline, Jr., Temperance, MI (US); Gary T. Faykosh, Perrysburg, OH (US)

(73) Assignee: Willard & Kelsey Solar Group, LLC, Toledo, OH (US)

( * ) Notice: Subject to any disclaimer, the term of this patent is extended or adjusted under 35 U.S.C. 154(b) by 456 days.

(21) Appl. No.: 12/020,764

(22) Filed: Jan. 28, 2008

(65) Prior Publication Data

US 2008/0187766 A1    Aug. 7, 2008

Related U.S. Application Data

(60) Provisional application No. 60/898,849, filed on Feb. 1, 2007.

(51) Int. Cl.
| | |
|---|---|
| *H01L 21/67* | (2006.01) |
| *B65G 49/06* | (2006.01) |
| *C23C 14/50* | (2006.01) |
| *C23C 14/56* | (2006.01) |
| *H01L 21/677* | (2006.01) |
| *H01L 21/687* | (2006.01) |

(52) U.S. Cl.
CPC ........ *H01L 21/67236* (2013.01); *B65G 49/066* (2013.01); *C23C 14/50* (2013.01); *C23C 14/566* (2013.01); *H01L 21/6776* (2013.01); *H01L 21/67706* (2013.01); *H01L 21/67712* (2013.01); *H01L 21/67721* (2013.01); *H01L 21/67754* (2013.01); *H01L 21/68707* (2013.01); *B65G 2249/02* (2013.01)

(58) Field of Classification Search
None
See application file for complete search history.

(56) References Cited

U.S. PATENT DOCUMENTS

| | | | |
|---|---|---|---|
| 3,391,958 A | | 7/1968 | Furer |
| 3,830,540 A | * | 8/1974 | Sperry .......................... 294/118 |
| 4,159,842 A | | 7/1979 | Perkowski |
| 4,545,327 A | | 10/1985 | Campbell et al. |
| 4,593,644 A | | 6/1986 | Hanak |
| 5,016,562 A | | 5/1991 | Madan et al. |
| 5,248,349 A | | 9/1993 | Foote et al. |
| 5,288,329 A | * | 2/1994 | Nakamura et al. ............ 118/729 |
| 5,372,646 A | | 12/1994 | Foote et al. |
| 5,470,397 A | | 11/1995 | Foote et al. |
| 5,536,333 A | | 7/1996 | Foote et al. |
| 6,013,134 A | | 1/2000 | Chu et al. |
| 6,017,396 A | * | 1/2000 | Okamoto ...................... 118/719 |
| 6,827,788 B2 | | 12/2004 | Takahashi |
| 2001/0026748 A1* | | 10/2001 | Blonigan et al. .............. 414/217 |
| 2002/0011672 A1* | | 1/2002 | Oku et al. ...................... 257/758 |
| 2002/0160627 A1 | | 10/2002 | Kunz et al. |
| 2003/0029848 A1* | | 2/2003 | Borgeson et al. ........ 219/121.69 |

(Continued)

*Primary Examiner* — Joseph Miller, Jr.
(74) *Attorney, Agent, or Firm* — Brooks Kushman P.C.

(57) ABSTRACT

A system (20) and method for coating semiconductor material on glass sheets is performed by conveying the glass sheets vertically suspended at upper extremities thereof through a system (20) having a housing (22) including a vacuum chamber (24). The glass sheets are conveyed on shuttles (42) through an entry load lock station (26) into the housing vacuum chamber (24), through a heating station (30) and at least one deposition station (32, 34) in the housing (22), and to a cooling station 36 prior to exiting of the system through an exit load lock station (28). The resultant semiconductor coated glass sheet (G) has tong marks (44') formed during the coating processing.

8 Claims, 7 Drawing Sheets

(56) References Cited

U.S. PATENT DOCUMENTS

2003/0205558 A1* 11/2003 Kuzuwa et al. ............... 216/97
2006/0032440 A1 2/2006 Nolan
2007/0137574 A1 6/2007 Sichanugrist et al.
2008/0160205 A1* 7/2008 Gasworth ..................... 427/446

* cited by examiner

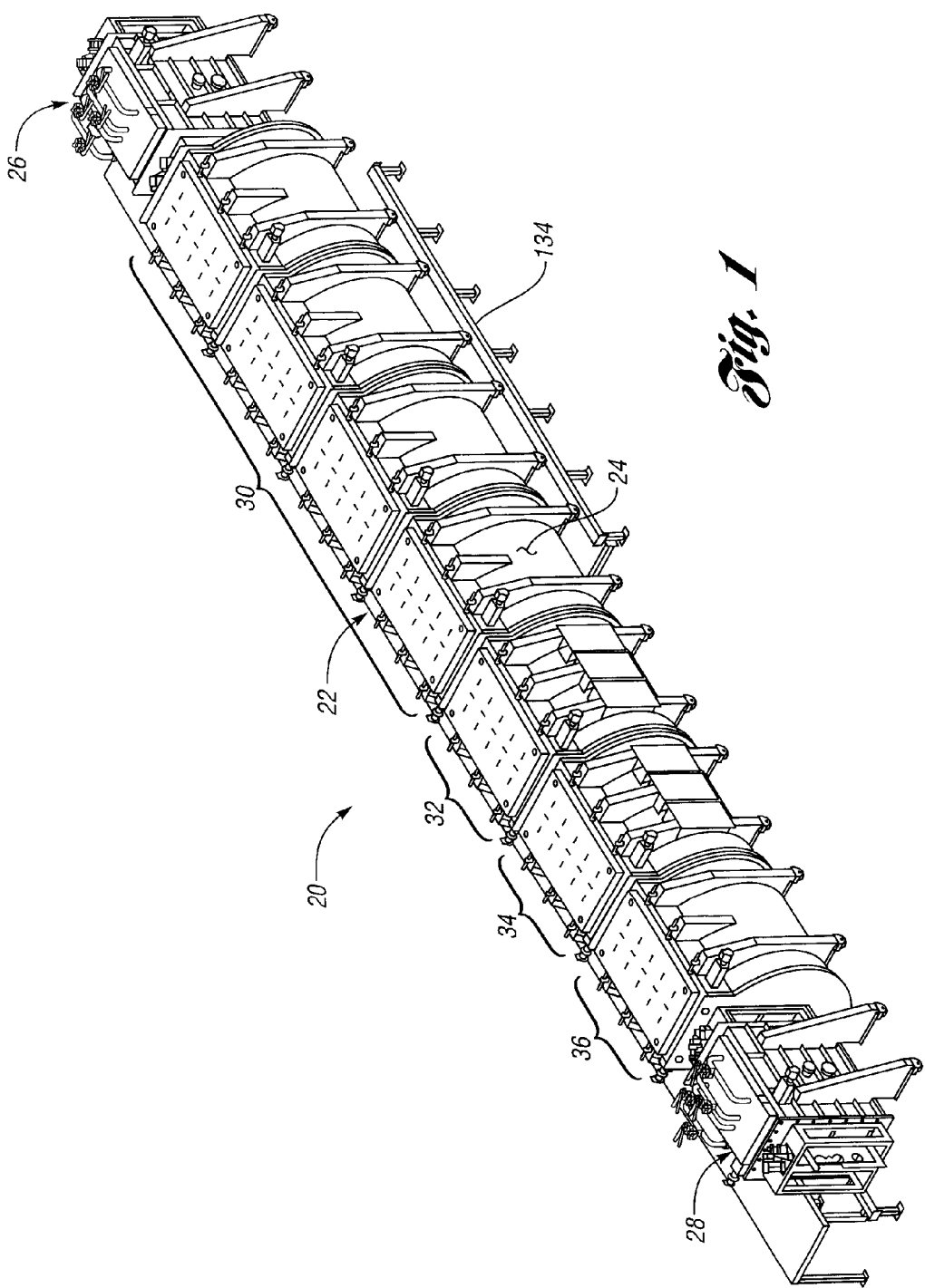

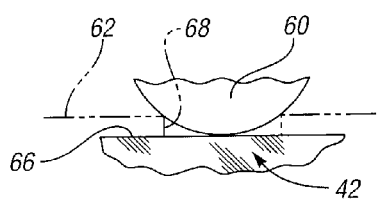
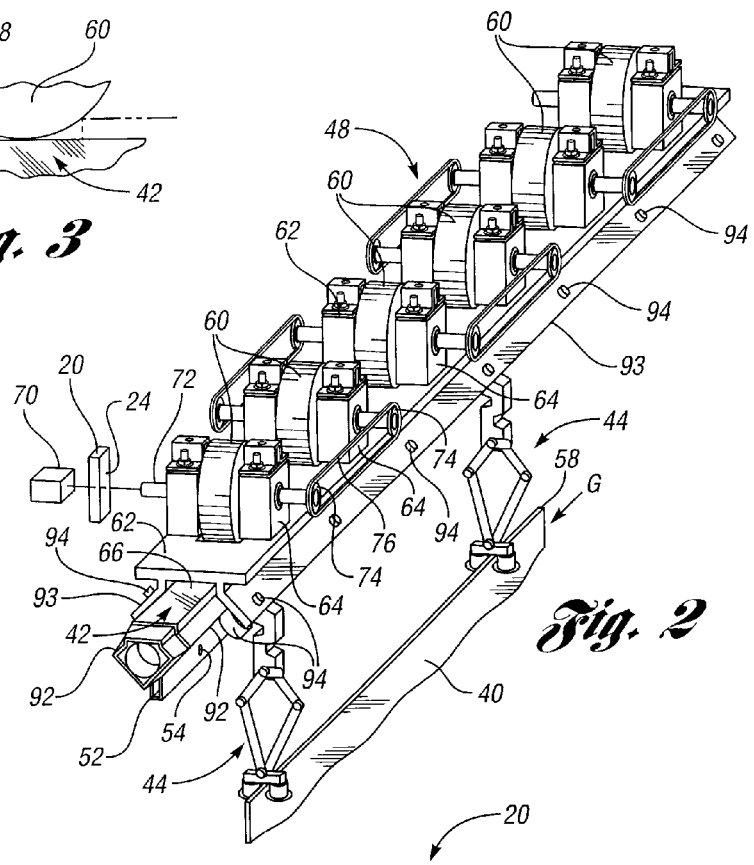
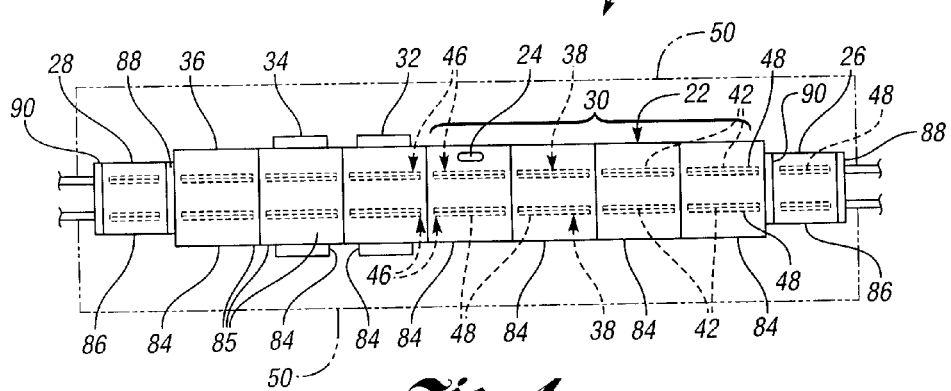

METHOD FOR GLASS SHEET SEMICONDUCTOR COATING

CROSS-REFERENCE TO RELATED APPLICATIONS

This application claims the benefit of U.S. provisional application Ser. No. 60/898,849 filed on Feb. 1, 2007 by James E. Heider under the title COATING MACHINE AND PROCESS TO COAT SEMICONDUCTOR MATERIALS FOR USE IN PHOTOVOLTAIC DEVICES.

BACKGROUND OF THE INVENTION

1. Field of the Invention

This invention relates to a method for glass sheet coating with semiconductor material.

2. Background Art

Semiconductor devices such as photovoltaic panels have previously been constructed with glass sheet substrates on which semiconductor material is coated. See U.S. Pat. No. 5,016,562 Madan et al.; U.S. Pat. No. 5,248,349 Foote et al.; U.S. Pat. No. 5,372,646 Foote et al; U.S. Pat. No. 5,470,397 Foote et al.; and U.S. Pat. No. 5,536,333 Foote et al., all of which disclose horizontal rollers for conveying glass sheets during such coating.

Other prior art references noted during an investigation conducted in connection with the present invention include U.S. Pat. No. 4,545,327 Campbell et al; U.S. Pat. No. 4,593,644 Hanak; U.S. Pat. No. 5,288,329 Nakamura et al; U.S. Pat. No. 6,013,134 Chu et al.; and U.S. Pat. No. 6,827,788 Takahashi as well as United States Published Patent Application US 2007/0137574.

SUMMARY OF THE INVENTION

An object of the present invention is to provide an improved method for coating semiconductor material on a glass sheet.

In carrying out the above object, the method for coating semiconductor material on a glass sheet according to the invention is preformed by solely supporting the glass sheet on a horizontally elongated shuttle by a pair of tongs at an upper extremity of the glass sheet so as to be suspended in a vertical orientation, and horizontally conveying the shuttle with the glass sheet vertically suspended therefrom by drive mechanisms located along a direction of conveyance through an entry load lock into and through a vacuum chamber. The conveyed glass sheet is heated in the vacuum chamber between spaced radiant heaters, and semiconductor material is then deposited on the heated glass sheet during continued horizontal conveyance. Thereafter, the shuttle and the semiconductor coated glass sheet vertically suspended therefrom are horizontally conveyed by the drive mechanisms located long the direction of conveyance out of the vacuum chamber through an exit load lock for delivery.

The vertical glass sheet is disclosed as being supported by a shuttle that is conveyed through the system by magnetic rotary drive members of drive mechanisms located along system.

Furthermore, the glass sheet as disclosed as being heated by radiant heaters including vertical radiant heating slabs spaced on opposite sides of the conveyed vertical glass sheet, and the coated glass sheet is disclosed as being cooled by radiant heat absorbers including cooling slabs that extend vertically in a spaced and parallel relationship to each other and between which the vertical glass sheet is positioned during the conveyance for the cooling.

Another object of the present invention is to provide an improved semiconductor coated glass sheet.

In carrying out the immediately preceding object, a semiconductor coated glass sheet according to the invention includes a glass sheet having at least one layer of a semiconductor material deposited thereon by vapor deposition while the glass sheet is heated and conveyed vertically by suspension at an upper extremity thereof by tongs that deform the glass sheet and leave tong marks that remain after cooling of the glass sheet.

As disclosed, the glass sheet includes a layer of tin oxide on one surface thereof, a first semiconductor layer coated over the layer of tin oxide, and a second semiconductor layer coated over the first semiconductor layer.

The objects, features and advantages of the present invention are readily apparent from the detailed description of the preferred embodiment when taken in connection with the accompanying drawings.

BRIEF DESCRIPTION OF THE DRAWINGS

FIG. 1 is a perspective view of a system that performs the method of the invention to coat semiconductor material on glass sheets.

FIG. 2 is a perspective view illustrating a drive mechanism and shuttle utilized to suspend the glass sheets vertically from upper extremities thereof and provide conveyance thereof through the system.

FIG. 3 is a partial view illustrating the manner in which magnetic rotary drive members support and rotatively drive the shuttle and the vertical glass sheet suspended from the shuttle.

FIG. 4 is a top schematic view of the system illustrating its modular construction and the provision of a pair of side-by-side conveyors that convey the glass sheets vertically through a housing vacuum chamber of the system for the semiconductor deposition.

FIG. 5 is a sectional view through a glass sheet on which semiconductor material has been coated with the semiconductor material thicknesses exaggerated for purposes of illustration.

DETAILED DESCRIPTION OF THE PREFERRED EMBODIMENT

Figure 6:
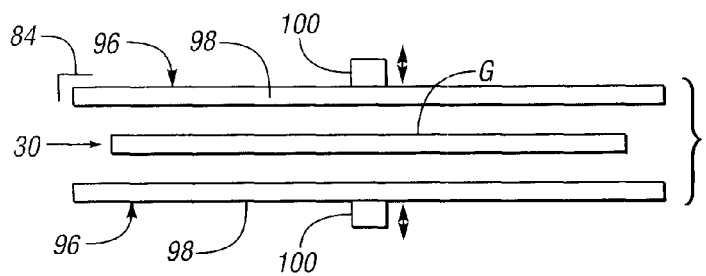
FIG. 6 is a schematic plan view illustrating radiant heaters in a heating station of the furnace for providing radiant heating of the vertically conveyed glass sheet in preparation for the semiconductor deposition.

With reference to FIG. 1, a system 20 for coating semiconductor material on glass sheets is generally indicated by 20 and is operated to perform the method for coating glass sheets with a semiconductor material in accordance with the invention.

With continuing reference to FIG. 1, the system 20 includes an elongated housing collectively indicated by 22 and having a vacuum chamber 24 in which the semiconductor coating takes place. An entry load lock station 26 of the system provides provision for glass sheet entry into the vacuum chamber 24 and an exit load lock station 28 provides for exiting of the coated glass sheet out of the vacuum chamber 24 after the coating. The housing includes a heating station 30 for heating glass sheets, a pair of deposition stations 32 and 34 for supplying semiconductor material for vapor deposition, and a cooling station 36 all of which are hereinafter described in greater detail.

The system 20 as shown in FIG. 4 includes a pair of conveyors 38 extending alongside each other in a side-by-side relationship through the elongated housing 22. Each conveyor 38 supports upper extremities 40 of vertical glass sheets G as shown in FIG. 2 and provides suspended conveyance of these vertical glass sheets through the system. This conveyance is initially into and through the entry load lock station 26 into the housing vacuum chamber 24 through the heating station 30 for heating of the glass sheets, thereafter through the two deposition stations 32 and 34 for deposition of semiconductor material on the glass sheets, then to the cooling station 36, and finally out of the vacuum chamber 24 through the exit load lock station 28 for delivery of the coated glass sheets.

As illustrated in FIGS. 2 and 4, the conveyors 38 include horizontally elongated shuttles 42 for solely supporting the upper extremities 40 of the glass sheets by tongs 44 in a vertically suspended manner. The tongs 44 may be of the type disclosed by U.S. Pat. No. 3,391,958 Furer, the entire disclosure of which is hereby incorporated by reference. Each conveyor 38 shown in FIG. 4 also includes a drive collectively indicated by 46 and having drive mechanisms 48 located along the system for horizontally conveying the shuttles and the vertical glass sheets suspended therefrom through the system. Thus, the drive 46 through its drive mechanisms 48 horizontally conveys the shuttles first into the entry load lock station 26 and from there into the vacuum chamber 24 of the elongated housing 22 for horizontal conveyance through the heating station 30, deposition stations 32 and 34, the cooling station 36, and finally to the exit load lock station 28 for exit from the system and delivery of the coated glass sheets. Any type of suitable return conveyors 50 can be utilized to convey the shuttles 42 after egress from the exit load lock station 28 back to the entry load lock station 26 for another cycle.

As shown in FIGS. 2 and 4, each shuttle 42 has an elongated shape and a downwardly depending support portion 52 (FIG. 2) with holes 54 spaced therealong to receive and support the tongs 44 at the appropriate locations for the particular length of glass sheet being conveyed so that the suspended support is generally adjacent the upstream and downstream ends 56 and 58 of the upper extremity 40 of the glass sheet G being conveyed. The drive mechanisms 48 of the conveyor drive 46 each have an elongated shape and include rotary drive members 60 spaced along the elongated shape thereof to rotatively drive the shuttles 42 for the conveyance of the vertical glass sheets into, through and out of the system. More specifically, the rotary drive members 60 are supported on an elongated plate 62 by bearings 64 and are magnetic so as to provide the rotary driving of the shuttles 42 for the conveyance. The shuttles 42 have upper support and drive surfaces 66 which are supported by the magnetic rotary drive members 60 that project downwardly through holes 68 in the plate 62 as shown in FIG. 3 into supporting and driving contact with the upper shuttle surfaces 60.

The conveyor drive mechanisms 48 of the conveyor drive 46 as previously discussed are spaced along the length of the system and each has an associated electric drive motor 70 as shown in FIG. 2 spaced outwardly of the housing 22 from the vacuum chamber 24 as shown schematically. The shaft output of each drive motor 70 extends through a hermetically sealed bearing to one end of a drive shaft 72 of the adjacent magnetic rotary drive member 60, with the other end of the shaft being connected to a drive sprocket 74 for driving a continuous loop drive belt or chain 76 that drives another sprocket 74 on one end of the shaft 72 of the adjacent magnetic rotary drive member 60, and associated sprockets and continuous drive members on alternating sides of the drive mechanism 48 in turn provide rotary driving of all of the magnetic rotary drive members 60 in coordination with each other.

As shown in FIG. 5, the semiconductor material deposition is performed on one surface of the glass sheet G which initially has a coating of tin oxide 78 that provides an electrical contact. After the heating in the heating station 30 shown in FIG. 4, the first deposition station 32 provides a layer of cadmium sulfide 80 which is a N-type semiconductor and has a thickness on the order of about 0.15 microns. As the glass sheet conveyance proceeds to the second deposition station 34, a layer of cadmium telluride 82 is deposited over the cadmium sulfide layer 80 with a thickness on the order of about 3 microns to provide an I-type semiconductor. After such deposition and exiting from the system, the tin oxide layer 78, cadmium sulfide layer 80 and the cadmium telluride layer 82 can be separated into a plurality of cells and provided with another contact over the cadmium telluride layer 82 to function as a multi-cell photovoltaic panel for generating electricity from sunlight.

The system housing 22 schematically shown in FIG. 4 has a modular construction including a number of housing modules 84 having opposite ends 85 connected to each other to provide the housing 22, which includes the heating station 30, the deposition stations 32 and 34, and the cooling station 36. The conveyor drive 46 has one of the previously described drive mechanisms 48 extending along the length of each housing module 84 between its upstream and downstream ends to provide the conveyance of the shuttles 42 and the glass sheets suspended therefrom through the vacuum chamber of the system housing for the heating, deposition and cooling.

The entry and exit load lock stations 26 and 28 also each include an associated housing module 86 through which the conveyors 38 extend to provide the glass sheet conveyance into and out of the vacuum chamber 24 defined by the housing 22. These load lock housings 86 each have entry and exit door structures 88 and 90 whose structure is hereinafter more fully described.

As the processing begins with the glass sheet conveyance from the right toward the left as shown in FIG. 4, the entry door structure 88 of the entry load lock station 26 is opened to permit conveyance of a shuttle 42 and glass sheet suspended vertically therefrom into the associated housing 86 whereupon the entry door structure is closed and the entry load lock station is evacuated by a vacuum pump to provide a vacuum of about 20 Torr. Upon reaching the required vacuum state, the exit door structure 98 is opened to permit the shuttle to be conveyed to the initial drive mechanism 48 of the heating station 30 with the shuttle bridging the drive mechanisms as it moves along from the entry load lock station into each housing module to the next through the heating station 30, depositions stations 32 and 34, and the cooling station 36. After the initial entry into the vacuum chamber of the housing 22, the exit door structure 90 of the entry load lock station 26 is closed whereupon its housing module 86 is brought back to ambient pressure, and its entry door structure 88 is opened to permit conveyance of the next shuttle 42 and glass sheet suspended therefrom into the entry load lock station to initiate processing of the next cycle.

After each shuttle 42 has been processed within the vacuum chamber of housing 22 of the system 20, the shuttle approaches the exit load lock station 28 whose entry and exit door structures 88 and 90 shown in FIG. 4 are closed as its housing module 86 is evacuated to a vacuum of about 20 Torr. The entry door structure 88 of the exit load lock station 28 is then opened to permit the shuttle and suspended glass sheet conveyance into the exit load lock station 28 whereupon its entry door structure 88 is closed and its housing is brought to ambient pressure, and its exit door structure 90 is subsequently opened to permit conveyance of the shuttle and suspended glass sheet out of the system for delivery.

It should be noted that the cooling station 36 as disclosed is located upstream from the exit load lock station 28 to facilitate the operation and common construction of both the entry and exit load lock stations 26 and 28. However, it is also possible for the cooling station to be located within the exit load lock station 28 even though the upstream location shown is preferred. Such cooling is important in reducing the temperature of the semiconductor material to below about 400° C. before exposure to oxygen and any consequent reaction of the oxygen with the semiconductor material.

With reference back to FIG. 2, it should be noted that each shuttle has opposite lateral sides 92 and the drive mechanism plate 62 has angled sides 93 supporting failsafe rollers 94 positioned below the opposite lateral shuttle sides 92. While the magnetic rotary drive members 60 support the shuttle 42 just slightly above the failsafe rollers 94, these failsafe rollers 94 ensure that the shuttle 42 does not drop down under the force of gravity or otherwise.

As shown in FIG. 6, each housing module 84 of the heating station includes radiant heaters 96 spaced on opposite sides of the vertically conveyed glass sheet, and these radiant heaters 96 are embodied by radiant heating slabs 98 that are oriented vertically in a spaced and parallel relationship to each other such that the vertically conveyed glass sheet moves therebetween. Any type of suitable position adjuster 100 may be utilized to adjust the radiant heater spacing to provide uniformity of the glass sheet from both its oppositely facing surfaces.

Figure 7:
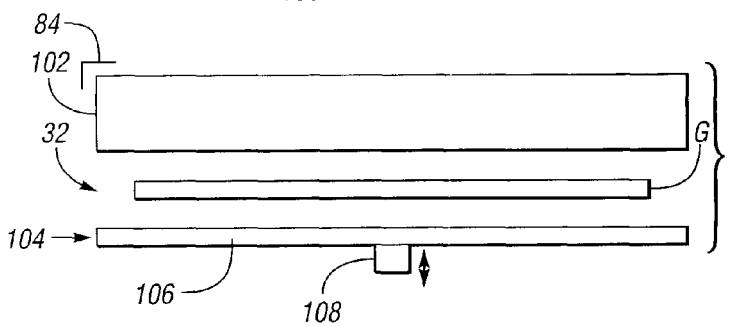
FIG. 7 is a schematic top plan view illustrating the vertical glass sheet during conveyance within a deposition station where the semiconductor material is deposited.

Each of the deposition stations 32 and 34 shown in FIG. 4 has a construction like that shown in FIG. 7 with its housing module 84 receiving a deposition module 102 and a vertically extending radiant heater 104 between which the glass sheet G is conveyed for deposition of the associated semiconductor material onto the glass sheet. The radiant heater 104, like the radiant heater in the heating station, includes a vertically extending heating slab 106 whose position can be changed as necessary by an adjuster 108 to provide uniformity of the glass temperature during the deposition. It is also possible for the deposition module 102 to include a radiant heater incorporated therein in addition to having provision for supplying hot gas that is deposited as the semiconductor material.

Figure 8:
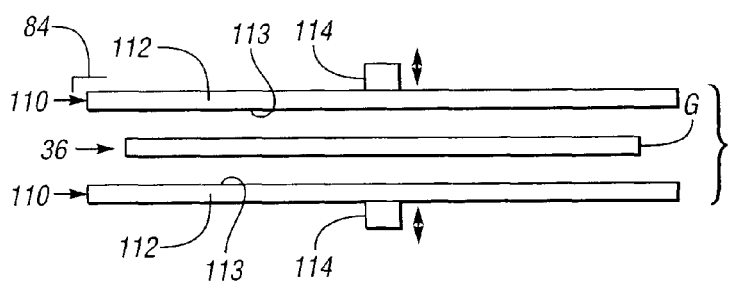
FIG. 8 is a schematic top plan view illustrating the semiconductor coated glass sheet as it is conveyed through a cooling station where radiant heat absorbers provide cooling of the glass sheet.

The cooling station 36, whether located upstream from the exit load lock station 28 or within the exit load lock station includes radiant heat absorbers 110 that are shown in FIG. 8 as constructed as radiant cooling slabs 112 extending vertically in a spaced and parallel relationship to each other and between which the semiconductor coated vertical glass sheet is positioned for cooling. The radiant cooling slabs 112 have opposed generally continuous planar surfaces 113 at which the radiant heat is absorbed from the semiconductor coated hot glass sheet. Adjusters 114 control the positioning between the radiant cooling slabs 112 and the glass sheet G so as to provide uniformity of cooling.

The semiconductor coated hot glass sheet according to another invention can also be conveyed horizontally during the cooling as disclosed by related U.S. patent application Ser. No. 12/020,772 filed concurrently herewith on Jan. 28, 2010 by James E. Heider et al. under the title SYSTEM AND METHOD FOR COOLING SEMICONDUCTOR COATED HOT GLASS SHEETS, the entire disclosure of which is hereby incorporated by reference.

Different materials may be utilized to provide the radiant heating slabs 98 in the heating station, any radiant heater of the deposition module 102 and the radiant heating slab 106 of each deposition station, and the radiant cooling slabs 112 of the cooling station. For example, graphite is a relatively inexpensive material that can be utilized and has good thermal conductivity so as to provide uniformity and temperature throughout; however graphite oblates even in vacuum and is sensitive to oxygen. Alpha state silicon carbide may also be utilized as it is non-porous, shock resistant and impervious to oxygen; however, it is also relatively expensive. It is possible to embed heater elements within the radiant heaters of the heating station and the deposition stations or to provide the radiant heat through the slab from heaters such as quartz tubes with Nichrome heating elements so that the slabs act as heat spreaders. Other radiant heater designs may also be possible.

During the glass sheet processing, each glass sheet can be conveyed within the housing modules in a single direction from the entrance end to the exit end, can be oscillated back and forth at each module in a forward and backward direction or can be moved forwardly a certain extent and then backward a lesser extent successively such as in a two steps forward and one step back manner.

Figure 9:
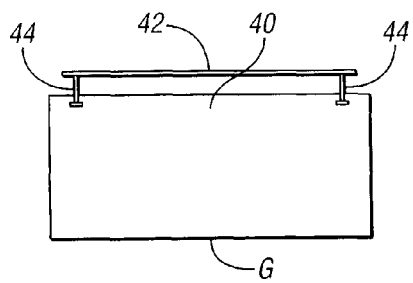
FIG. 9 is an elevational view illustrating one manner in which an elongated glass sheet is conveyed with its longer axis horizontal.
Figure 10:
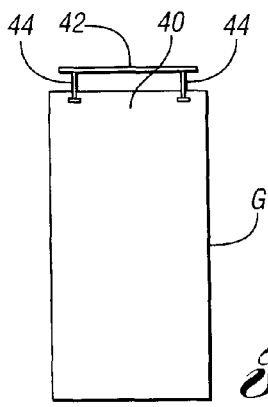
FIG. 10 is a view similar to FIG. 9 illustrating another way in which the elongated glass sheet is conveyed with its longer axis vertical.
Figure 10A:
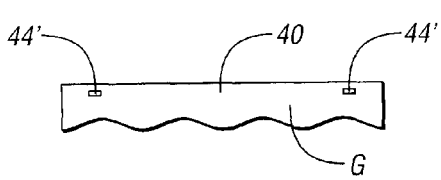
FIGS. 10a and 10b are side and end views of the resultant glass sheet regardless of whether conveyed as shown in FIG. 9 or shown in FIG. 10 and illustrates the resultant upper extremity 40 as including tong marks 44' on both surfaces of the glass sheet.
Figure 10B:
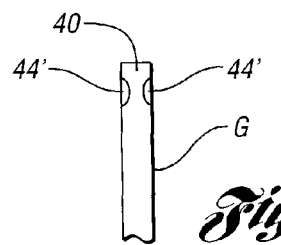

As illustrated in FIGS. 9 and 10, elongated glass sheets G can be suspended by the tongs from associated shuttles 42 with their longer axes horizontal or vertical. The vertical suspension will provide greater coating capability but requires a greater vertical height of the heating, coating and cooling station components.

Regardless of whether the glass sheet is suspended and conveyed vertically in a horizontally elongated orientation as shown in FIG. 9 or in a vertically elongated orientation as shown in FIG. 10, the resultant glass sheet will have its upper extremity 40 deformed with tong marks 44' on both of the oppositely facing surfaces of the glass sheet. These tong marks 44' result from the deformation provided by the tongs with the glass sheet heated. Such tong marks 44' being located at the upper extremity are outside of the operational area of the semiconductor layers 80 and 82 over the tin oxide layer 78 as shown in FIG. 5 and do not adversely affect the operation of the resultant glass sheet such as when used as a photovoltaic panel. The vertical suspension at the upper extremity of the conveyed glass sheet while heated maintains planarity of the glass sheet and also facilitates uniform temperature heating without variations such as can result when heating on conveyor rolls whose radiation and conduction varies during the conveyance.

Figure 11:
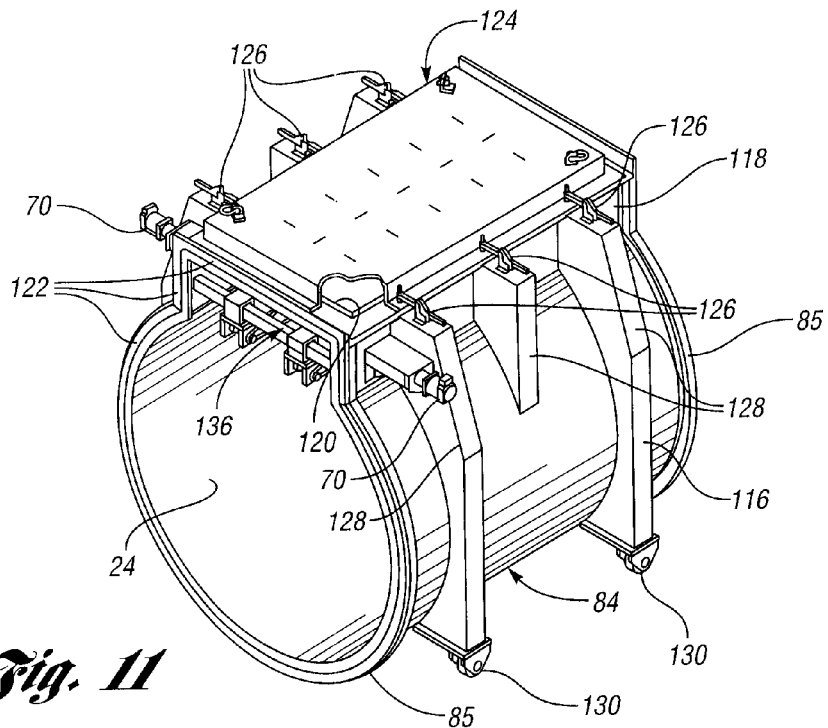
FIG. 11 is a perspective view illustrating one housing module of the system which cooperates with other modules to provide a housing defining a vacuum chamber.
Figure 12:
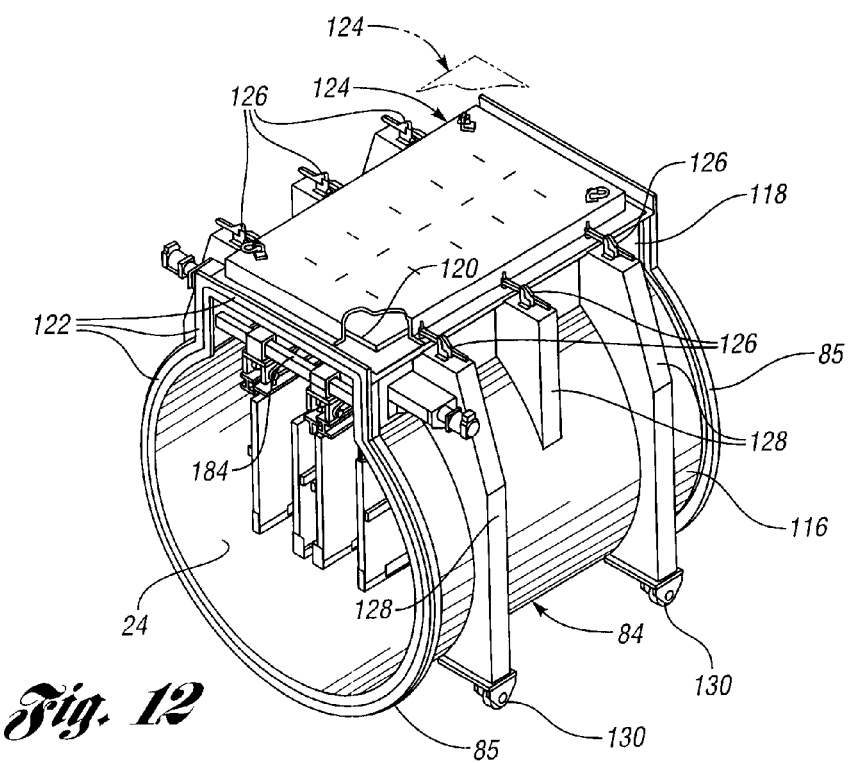
FIG. 12 is a view that is illustrative of the construction of the housing modules at either the heating station or the cooling station that are respectively illustrated in FIGS. 6 and 8.

The elongated housing 20 illustrated in FIGS. 1 and 4 has the ends 85 of the modules 84 previously described connected to each other to define the vacuum chamber 24. Each housing module 84 as shown in FIGS. 11 and 12 includes a partially circular lower housing portion 116 and an upper access portion 118 extending upwardly from the lower housing portion and having an upper access opening 120. End seals 122 extend around the lower housing portion 116 and the upper access portion 118 at ends 85 of the housing modules 84 for connection to adjacent modules by unshown bolt connections. A detachable cover 124 is secured by toggle clamps 126 in a closed position as illustrated by solid line representation, and the clamps are released to permit movement of the cover to an open position as partially shown by phantom line representation in FIG. 12 to provide access through the opening 120 for maintenance or repair.

Figure 13:
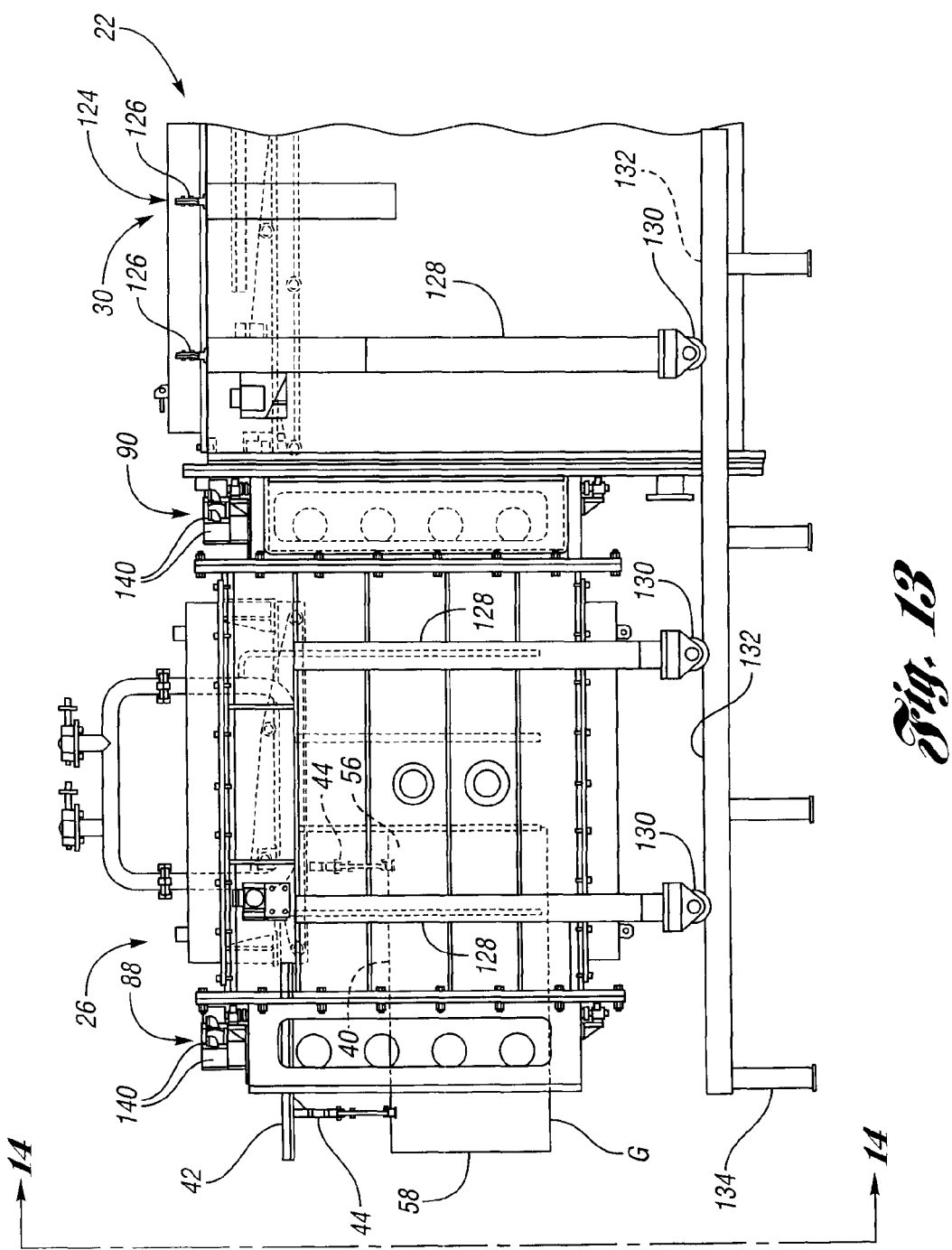
FIG. 13 is a side elevational view illustrating an load lock station through which glass sheets enter the vacuum chamber of the housing, and this view is also illustrative of an exit load lock station through which the coated glass sheets exit the vacuum chamber of the housing for delivery.
Figure 14:
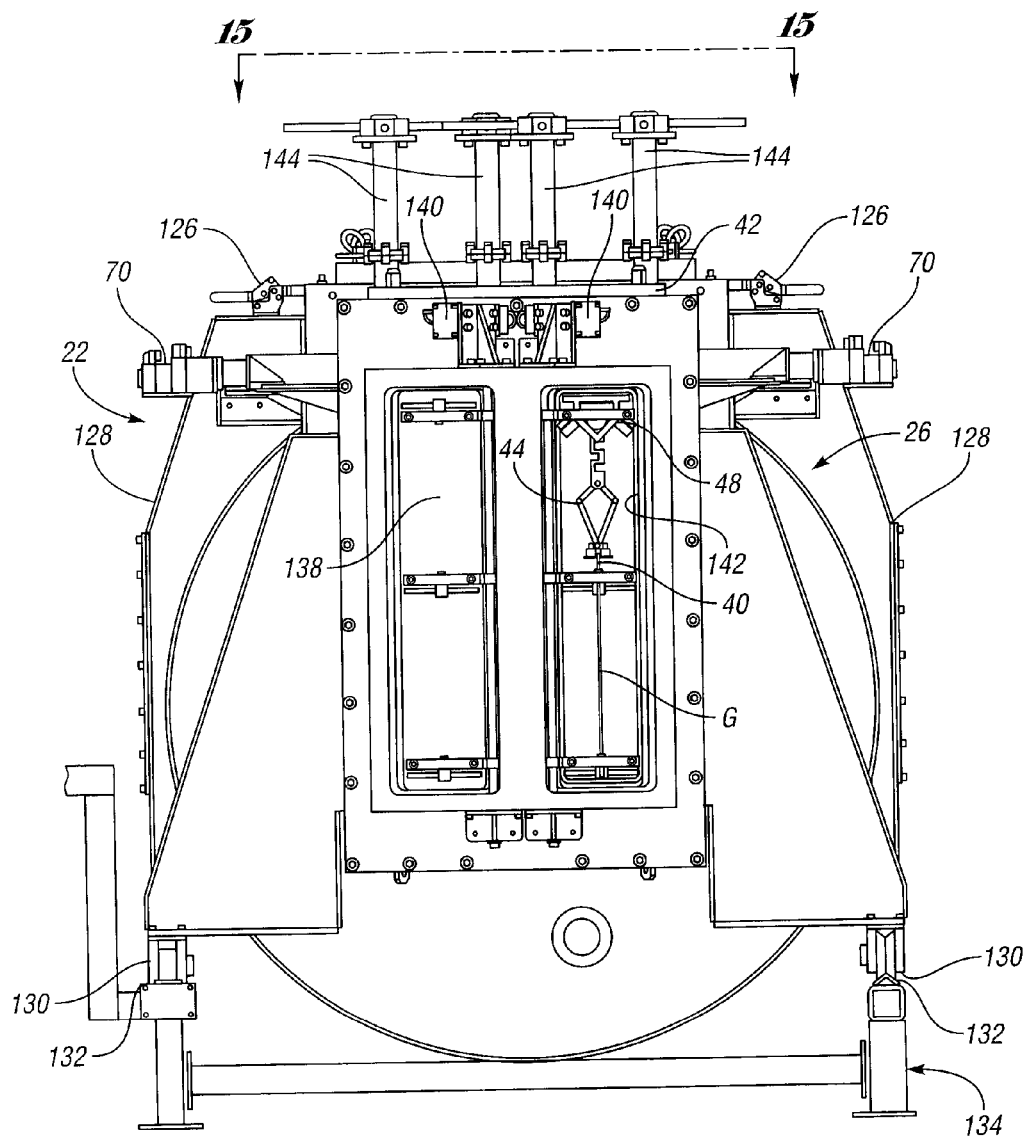
FIG. 14 is an end view taken along the direction of line 14-14 in FIG. 13 to further illustrate the load lock station construction.

Each housing module includes fabricated support ribs 128 as shown in FIGS. 11 and 12 with upper extremities of these ribs supporting the cover clamps 126 and with the lower extremities of two of the end ribs having support wheels 130 which, as best illustrated in FIGS. 13 and 14 are mounted on a track 132 of a floor framework 134 so as to permit longitudinal movement of the housing modules during assembly and disassembly. The entry load lock station 26 shown in FIG. 13 also has similar support ribs 128 whose lower extremities mount support wheels 130 that are supported and movable along the floor framework track 132, and the exit load lock station 28 shown in FIG. 4 has the same support wheel construction.

As shown in FIGS. 11 and 12, an internal framework collectively indicated by 136 is received and supported by the upper access portions 118 of the housing modules 84 and supports the drive mechanisms 48 of the conveyor drive 46 as well as supporting the heating station radiant heaters 96 shown in FIG. 6, the deposition module 102 and radiant heater 104 of the deposition station shown in FIG. 7, and the radiant heat absorbers 110 of the cooling station 36 shown in FIG. 8.

Figure 15:
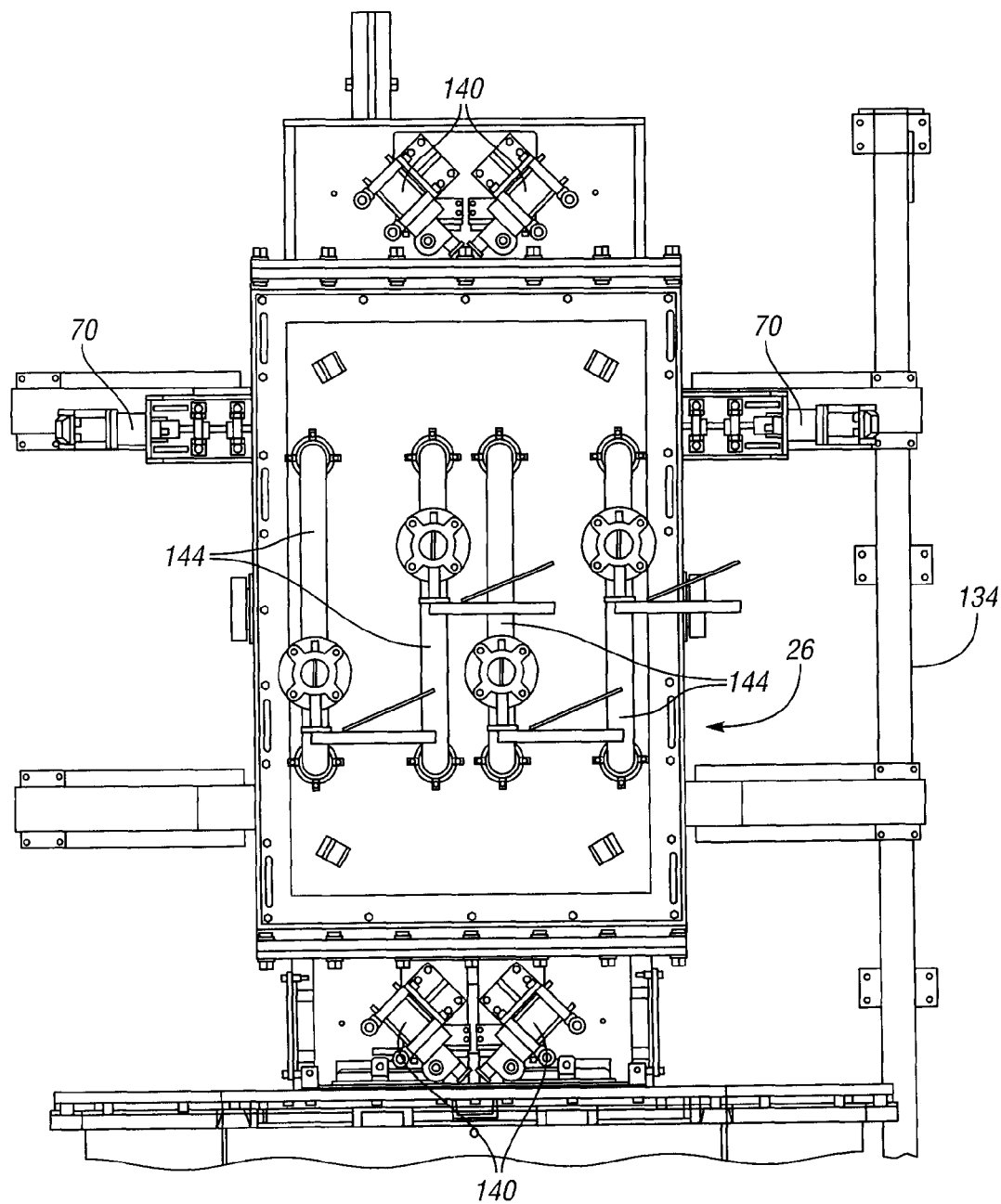
FIG. 15 is a top plan view of the load lock station taken along the direction of line 15-15 in FIG. 14.

With reference to FIGS. 13 and 14, the entry load lock station 26 and the exit load lock station 28 have entry and exit door structures 88 and 90 that are generally the same. More specifically, each of the door structures 88 and 90 includes a pair of hinged doors 138 illustrated in FIG. 14 and shown with the left door closed and the right door open for purposes of illustration of the conveyor structure. These doors 138 are hinged about lateral outer vertical axes and each is operated by an associated upper actuator 140 as shown in FIG. 15 to provide opening and closing in the manner previously discussed in connection with FIG. 4. The conveyor drive mechanisms 48 provide conveyance of the shuttles 42 through door openings 142 with the doors open as shown in the right conveyor of FIG. 14. Drive motors 70 located externally in the ambient are connected to these drive mechanisms as previously described in connection with FIG. 2. Furthermore, conduits 144 are provided for the connection to vacuum pumping and ambient pressure supply as necessary during the door operation.

A specific way of processing with the system 20 described above to provide photovoltaic panels will now be described. Such processing starts with tin oxide coated glass sheets approximately 3.2 millimeters thick of a size of 600 millimeters by 1200 millimeters which is approximately 24 inches by 48 inches. Initially the edges of the glass sheet substrate are diamond ground to a number 1 pencil and are polished finish to provide comfort in handling and eliminate fissures that can cause breakage during handling and heat treatment. The edging speed must be approximately 40 millimeters per second, i.e., 90 inches per minute, in order to obtain a two piece per minute cycle rate into the system. After the edging, the glass sheet substrate is washed, to remove particulates and provide preparation for coating, with a suitable detergent that is then rinsed with deionized water to provide a mineral free surface after air drying. Upstream from the system 20, a suitable laser station will imprint a code on the glass sheet for production control and location during processing.

To provide cycle timing, the vacuum pump system is matched to the volume of the load lock chamber to provide a pump down time such as on the order of 21 seconds to 20 Torr. Conveyance into and out of each load lock station plus venting and pump down time amount to a 60 second total cycle time with the load lock chamber volume at 56 cubic feet, a pumping speed of 580 cubic feet per minute for the 21 second pump down time, 10 seconds for conveyance into the load lock station, 10 seconds for exiting, and 19 seconds to provide door actuation and atmospheric venting.

In the system heating station 30 previously described in connection with FIG. 4, the glass sheet substrate will be heated to approximately 585° C. in preparation for the initial semiconductor coating. This heating by the radiant heaters 96 previously described in connection with FIG. 6 will be provided with about 25 kilowatts per side in an initial zone and 16 kilowatts per side in subsequent zones with the radiant heat chamber being at approximately 680° C. so as to provide the desired glass surface substrate temperature of 580° C. in approximately 150 seconds. Of course, the transport speed can be varied for the particular glass sheet being coated along with the necessary temperatures.

During the deposition of the semiconductor material at the deposition modules 32 and 34 as previously described in connection with FIG. 4, the hot gas supplied by the deposition module 102 shown in FIG. 7 maintains the substrate at a uniform temperature in association with the backside radiant heater 104. The vertical orientation eliminates the potential for pinholes, nucleated materials and condensed vapor from making contact with the glass sheet substrate. Uniformity of the film thickness is dependent upon the temperature of the glass sheet substrate and the source vapor geometry, and the electrical quality is dependent on the lack of voids or pre nucleated material that sticks to the surface.

At the initial deposition station 32 shown in FIG. 4, the cadmium sulfide providing the N-layer is applied with the cadmium sulfide gas sublimed and heated to a temperature of 950° C. It is believed that the rate of coating will be about 1,000 angstrom per second to a total thickness of about 900 to 1,500 angstroms, and a suitable detection device within the deposition module will be utilized to scan the coating thickness.

The second deposition station 34 previously described in connection with FIG. 4 provides the cadmium telluride layer which is a P-layer. The glass sheet substrate temperature will be approximately 605° C., the cadmium telluride will be sublimed and heated to about 1050° C. and the coating will be supplied through a variable aperture to control the rate of deposition which will be to a thickness of about 3 microns that is believed to be at a rate of 2.5 microns per second.

The cooling station 36 previously described in connection with FIG. 4 then receives the semiconductor coated glass sheet substrate to provide cooling below about 400° C. so as to prevent exposure to oxygen and consequent reaction therewith of the coated materials. It should be appreciated that it is possible to provide cooling by utilizing about 99.5 percent nitrogen in the exit load lock station 28, but the cost for the nitrogen would increase the cost per coated glass sheet. Likewise, while it is also possible to provide the radiant cooling in the exit load lock station as previously discussed, such processing will result in an increased exit time that could increase the cycle time.

After the coated glass sheet leaves the exit load lock station for delivery, a suitable after cooler will provide cooling to about 50° C. for handling. The thickness of the cadmium telluride will then be tested to confirm correctness, a dilute aqueous solution of cadmium chloride is sprayed or rolled onto the semiconductor coatings and the glass sheet is then heated to about 400° C. for about 15 minutes to facilitate the conversion of light to electricity. The treated glass sheet is then washed with deionized water, rinsed and dried. Suitable laser scribing and processing then is utilized to then convert a semiconductor coated glass sheet to a photovoltaic panel.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for coating semiconductor material on a glass sheet comprising:

solely supporting the glass sheet on a horizontally elongated shuttle by a pair of tongs at an upper extremity of the glass sheet so as to be suspended in a vertical orientation;

horizontally conveying the shuttle with the glass sheet vertically suspended therefrom by drive mechanisms located along a direction of conveyance through an entry load lock station into and through a vacuum chamber;

heating the vertically suspended glass sheet between spaced radiant heaters during the horizontal conveyance in the vacuum chamber;

then depositing a coating of a semiconductor material on the heated and vertically suspended glass sheet during continued horizontal conveyance in the vacuum chamber;

thereafter horizontally conveying the shuttle with the semiconductor coated glass sheet vertically suspended therefrom by the drive mechanisms located along the direction of conveyance out of the vacuum chamber through an exit load lock station for delivery; and wherein a pair of conveyors extending parallel to each other support the shuttles and the tongs thereon to provide suspended conveyance of vertical glass sheets on each conveyor for the coating of semiconductor material on the surfaces thereof that face away from the other conveyor.

2. A glass sheet semiconductor coating method as in claim 1 wherein the vertically suspended glass sheet is supported at the upper extremity thereof by the shuttle and is conveyed into, though, and out of the vacuum chamber by magnetic rotary drive members of the drive mechanisms located along the direction of conveyance.

3. A glass sheet semiconductor coating method as in claim 1 wherein the glass sheet is heated by radiant heaters including vertical radiant heating slabs spaced on opposite sides of the vertically suspended glass sheet during the conveyance of the shuttle and the glass sheet in the vacuum chamber.

4. A glass sheet semiconductor coating method as in claim 1 wherein the semiconductor coated glass sheet is cooled by radiant heat absorbers including cooling slabs that extend vertically in a spaced and parallel relationship to each other and between which the semiconductor coated glass sheet is conveyed while suspended from the shuttle for the cooling.

5. A glass sheet semiconductor coating method as in claim 1 wherein the vertical glass sheet is: heated by radiant heaters including vertical radiant heating slabs spaced on opposite sides of the conveyed vertically suspended glass sheet; and cooled by radiant heat absorbers including cooling slabs that extend vertically in a spaced and parallel relationship to each other and between which the vertically suspended semiconductor coated glass sheet is positioned during the conveyance for the cooling.

6. A method for coating semiconductor material on a glass sheet comprising:

solely supporting the glass sheet on a horizontally elongated shuttle by a pair of tongs at an upper extremity of the glass sheet so as to be suspended in a vertical orientation;

horizontally conveying the shuttle with the glass sheet vertically suspended therefrom by drive mechanisms located along a direction of conveyance through an entry load lock station into and through a vacuum chamber;

heating the vertically suspended glass sheet during the horizontal conveyance in the vacuum chamber by radiant heaters including vertical radiant heating slabs spaced on opposite sides of the conveyed vertically suspended glass sheet;

then depositing a coating of a semiconductor material on the heated and vertically suspended glass sheet during continued horizontal conveyance in the vacuum chamber;

cooling the semiconductor coated glass sheet by radiant heat absorbers including cooling slabs that extend vertically in a spaced and parallel relationship to each other and between which the vertically suspended semiconductor coated glass sheet is moved during continued horizontal conveyance for the cooling;

horizontally conveying the shuttle with the semiconductor coated glass sheet vertically suspended therefrom by the drive mechanisms located along the direction of conveyance out of the vacuum chamber through an exit load lock station for delivery; and wherein a pair of conveyors extending parallel to each other support the shuttles and the tongs thereon to provide suspended conveyance of vertical glass sheets on each conveyor for the coating of semiconductor material on the surfaces thereof that face away from the other conveyor.

7. A method for coating semiconductor material on a glass sheet comprising:
- solely supporting the glass sheet on a horizontally elongated shuttle by a pair of tongs at an upper extremity of the glass sheet so as to be suspended in a vertical orientation;
- horizontally conveying the shuttle with the glass sheet vertically suspended therefrom by drive mechanisms located along a direction of conveyance through an entry load lock station into and through a vacuum chamber;
- heating the vertically suspended glass sheet during the horizontal conveyance in the vacuum chamber by radiant heaters including vertical radiant heating slabs spaced on opposite sides of the conveyed vertically suspended glass sheet;
- then depositing a layer of cadmium sulfide semiconductor material on the heated and vertically suspended glass sheet during continued horizontal conveyance in the vacuum chamber;
- thereafter depositing a layer of cadmium telluride semiconductor material over the layer of cadmium sulfide semiconductor material on the heated and vertically suspended glass sheet during continued horizontal conveyance in the vacuum chamber;
- cooling the semiconductor coated glass sheet by radiant heat absorbers including cooling slabs that extend vertically in a spaced and parallel relationship to each other and between which the vertically suspended semiconductor coated glass sheet is positioned during continued horizontal conveyance for the cooling;
- horizontally conveying the shuttle with the semiconductor coated glass sheet vertically suspended therefrom by the drive mechanisms located along the direction of conveyance out of the vacuum chamber through an exit load lock station for delivery; and wherein a pair of conveyors extending parallel to each other support the shuttles and the tongs thereon to provide suspended conveyance of vertical glass sheets on each conveyor for the coating of semiconductor material on the surfaces thereof that face away from the other conveyor.

8. A method for coating semiconductor material on a glass sheet as in claim 1 comprising: after depositing the coating of semiconductor material on the heating glass sheet depositing a coating of another semiconductor material over the initially deposited coating of semiconductor material.

* * * * *